United States Patent
Sin et al.

(10) Patent No.: US 8,372,210 B2
(45) Date of Patent: Feb. 12, 2013

(54) POST CMP SCRUBBING OF SUBSTRATES

(75) Inventors: Garrett H. Sin, San Jose, CA (US);
Terry Kin-Ting Ko, Millbrae, CA (US);
Sidney P. Huey, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 621 days.

(21) Appl. No.: 12/249,927

(22) Filed: Oct. 11, 2008

(65) Prior Publication Data
US 2009/0031512 A1 Feb. 5, 2009

Related U.S. Application Data

(62) Division of application No. 10/973,827, filed on Oct. 26, 2004.
(60) Provisional application No. 60/514,708, filed on Oct. 27, 2003.

(51) Int. Cl.
*B08B 3/00* (2006.01)
(52) U.S. Cl. .................... 134/26; 134/32; 134/36
(58) Field of Classification Search .......... None
See application file for complete search history.

(56) References Cited

U.S. PATENT DOCUMENTS

| | | | |
|---|---|---|---|
| 1,503,217 A | 7/1924 | Voulgares |
| 2,394,338 A | 2/1946 | Stine |
| 3,640,029 A | 2/1972 | Zildjian |
| 3,659,304 A | 5/1972 | Leonard |
| 5,200,571 A | 4/1993 | Gracey |
| 5,221,360 A | 6/1993 | Thompson et al. |
| 5,311,634 A | 5/1994 | Andros |
| 5,317,778 A | 6/1994 | Kudo et al. |
| 5,379,474 A | 1/1995 | Nakamura |
| 5,485,644 A | 1/1996 | Shinbara et al. |
| 5,526,835 A | 6/1996 | Olechow |
| 5,647,083 A | 7/1997 | Sugimoto et al. |
| 5,675,856 A | 10/1997 | Itzkowitz |
| 5,725,414 A | 3/1998 | Moinpour et al. |
| 5,729,856 A | 3/1998 | Jang et al. |
| 5,858,112 A | 1/1999 | Yonemizu et al. |
| 5,868,857 A | 2/1999 | Moinpour et al. |
| 5,870,793 A | 2/1999 | Choffat et al. |
| 5,875,507 A | 3/1999 | Stephens et al. |
| 5,906,687 A | 5/1999 | Masui et al. |
| 5,937,469 A | 8/1999 | Culkins et al. |
| 5,958,145 A | 9/1999 | Yonemizu et al. |
| 5,966,765 A | 10/1999 | Hamada et al. |
| 5,975,098 A | 11/1999 | Yoshitani et al. |
| 6,070,284 A | 6/2000 | Garcia et al. |
| 6,082,377 A | 7/2000 | Frey |
| 6,151,744 A | 11/2000 | Ohtani et al. |
| 6,173,468 B1 | 1/2001 | Yonemizu et al. |

(Continued)

FOREIGN PATENT DOCUMENTS

| | | |
|---|---|---|
| GB | 123574 | 2/1919 |
| GB | 711598 | 7/1954 |

(Continued)

OTHER PUBLICATIONS

Office Action of U.S. Appl. No. 10/973,827 mailed Oct. 24, 2007.

(Continued)

*Primary Examiner* — Eric Golightly
(74) *Attorney, Agent, or Firm* — Dugan & Dugan, PC

(57) ABSTRACT

A cleaning method is provided for brush cleaning a surface of a substrate. The method comprises scrubbing a first surface of the substrate with a brush having a first surface geometry; and then scrubbing the first surface of the substrate with a brush having a second surface geometry, wherein the first and the second surface geometries are different. Numerous other aspects are provided.

11 Claims, 3 Drawing Sheets

U.S. PATENT DOCUMENTS

| | | | |
|---|---|---|---|
| 6,202,658 | B1 | 3/2001 | Fishkin et al. |
| 6,254,688 | B1 | 7/2001 | Kobayashi et al. |
| 6,299,698 | B1 | 10/2001 | Emami et al. |
| 6,334,229 | B1 | 1/2002 | Moinpour et al. |
| 6,385,805 | B2 | 5/2002 | Konishi et al. |
| 6,523,553 | B1 | 2/2003 | Redeker et al. |
| 6,575,177 | B1 | 6/2003 | Brown et al. |
| 6,607,072 | B2 | 8/2003 | Bliven et al. |
| 6,616,516 | B1 | 9/2003 | Ravkin et al. |
| 6,733,596 | B1 | 5/2004 | Mikhaylichenko et al. |
| 6,851,152 | B2 | 2/2005 | Sotozaki et al. |
| 6,904,637 | B2 | 6/2005 | Sugarman |
| 6,986,185 | B2 | 1/2006 | Sugarman et al. |
| 7,007,333 | B1 | 3/2006 | Mikhaylichenko et al. |
| 7,063,749 | B2 | 6/2006 | Sugarman |
| 2001/0035197 | A1 | 11/2001 | Brown et al. |
| 2001/0044979 | A1 | 11/2001 | Ravkin |
| 2002/0053367 | A1 | 5/2002 | Kamikawa et al. |
| 2002/0121289 | A1 | 9/2002 | Brown et al. |
| 2005/0109371 | A1 | 5/2005 | Sin et al. |
| 2005/0211276 | A1 | 9/2005 | Yudovsky et al. |
| 2006/0096048 | A1 | 5/2006 | Mikhaylichenko et al. |
| 2008/0011325 | A1 | 1/2008 | Olgado |
| 2008/0210258 | A1 | 9/2008 | Yudovsky et al. |

FOREIGN PATENT DOCUMENTS

| | | |
|---|---|---|
| GB | 772599 | 4/1957 |
| JP | 64-7691 | 1/1989 |
| JP | 1-242184 | 9/1989 |
| JP | 05134398 | 5/1993 |
| JP | 07086218 | 3/1995 |
| JP | 07086222 | 3/1995 |
| JP | 09260321 | 10/1997 |
| JP | 10004072 | 1/1998 |
| JP | 10199849 | 7/1998 |
| JP | 11087288 | 3/1999 |
| JP | 11238713 | 8/1999 |
| WO | WO 00/59006 | 10/2000 |
| WO | WO 2007/145904 A2 | 12/2007 |

OTHER PUBLICATIONS

Apr. 24, 2008 Response to Office Action of U.S. Appl. No. 10/973,827 mailed Oct. 24, 2007.

Final Office Action of U.S. Appl. No. 10/973,827 mailed Jul. 28, 2008.

Notice of Abandonment of U.S. Appl. No. 10/973,827 mailed Feb. 27, 2009.

Office Action of U.S. Appl. No. 09/113,447 mailed Aug. 25, 1999.

Dec. 20, 1999 Response to Office Action of U.S. Appl. No. 09/113,447 mailed Aug. 25, 1999.

Final Office Action of U.S. Appl. No. 09/113,447 mailed Feb. 8, 2000.

Jun. 30, 2000 Response to Final Office Action of U.S. Appl. No. 09/113,447 mailed Feb. 8, 2000.

Office Action of U.S. Appl. No. 09/113,447 mailed Sep. 8, 2000.

Dec. 6, 2000 Response to Office Action of U.S. Appl. No. 09/113,447 mailed Sep. 8, 2000.

Final Office Action of U.S. Appl. No. 09/113,447 mailed Jan. 18, 2001.

Apr. 17, 2001 Response to Final Office Action of U.S. Appl. No. 09/113,447 mailed Jan. 18, 2001.

May 29, 2001 Response to Final Office Action of U.S. Appl. No. 09/113,447 mailed Jan. 18, 2001.

Notice of Allowance of U.S. Appl. No. 09/113,447 mailed Jun. 4, 2001.

Advisory Action of U.S. Appl. No. 09/113,447 mailed Jul. 11, 2000.

Advisory Action of U.S. Appl. No. 09/113,447 mailed Apr. 24, 2001.

Examiner Interview Summary Record of U.S. Appl. No. 09/113,447 mailed Jun. 27, 2000.

Restriction Requirement of U.S. Appl. No. 10/973,827 mailed Sep. 7, 2007.

Oct. 9, 2007 Response to Restriction Requirement of U.S. Appl. No. 10/973,827 mailed Sep. 7, 2007.

Ding et al., U.S. Appl. No. 13/646,670 (16653), filed Oct. 6, 2012.

POST CMP SCRUBBING OF SUBSTRATES

This application is a division of, and claims priority to, U.S. Non-Provisional patent application Ser. No. 10/973,827, filed Oct. 26, 2004, and titled, "POST CMP SCRUBBING OF SUBSTRATES", which claims priority to U.S. Provisional Patent Application Ser. No. 60/514,708, filed Oct. 27, 2003, and titled, "POST CMP SCRUBBING OF SUBSTRATES". Both of these patent applications are hereby incorporated by reference herein in their entirety for all purposes.

FIELD OF THE INVENTION

The present invention relates generally to systems for fabricating semiconductor devices, and is more particularly related to methods and apparatus for cleaning substrates.

BACKGROUND OF THE INVENTION

For fabrication of semiconductor devices, substrates such as thin slices or wafers of semiconductor material require polishing by a process that applies an abrasive slurry to a substrate's surfaces. After polishing, slurry residue is generally cleaned or scrubbed from substrate surfaces via mechanical scrubbing devices, such as polyvinyl acetate (PVA) brushes, brushes made from other porous or sponge-like material, or brushes made with nylon bristles.

Using conventional scrubbing techniques, an undesirable number of particles may remain on scrubbed substrate surfaces. Accordingly, a need exists for improved methods and apparatus for scrubbing substrates.

SUMMARY OF THE INVENTION

An inventive cleaning apparatus is provided for brush cleaning a surface of a substrate. The apparatus comprises a first brush having a first surface geometry adapted to scrub a major surface of the substrate, and a second brush having a second surface geometry different from the first surface geometry and adapted to scrub the major surface of the substrate.

In one aspect the cleaning apparatus comprises a first scrubbing apparatus having at least one brush with a profiled surface geometry, adapted to scrub a major surface of a substrate, and a second scrubbing apparatus having at least one brush with a smooth surface geometry, adapted to scrub a major surface of a substrate.

Also provided is an inventive method of cleaning a substrate. The inventive method comprises scrubbing a first surface of the substrate with a brush having a first surface geometry, and then scrubbing the first surface of the substrate with a brush having a second surface geometry. In this aspect the first and the second surface geometries also differ from each other.

Other features and aspects of the present invention will become more fully apparent from the following detailed description, the appended claims and the accompanying drawings.

DETAILED DESCRIPTION

Figure 1:
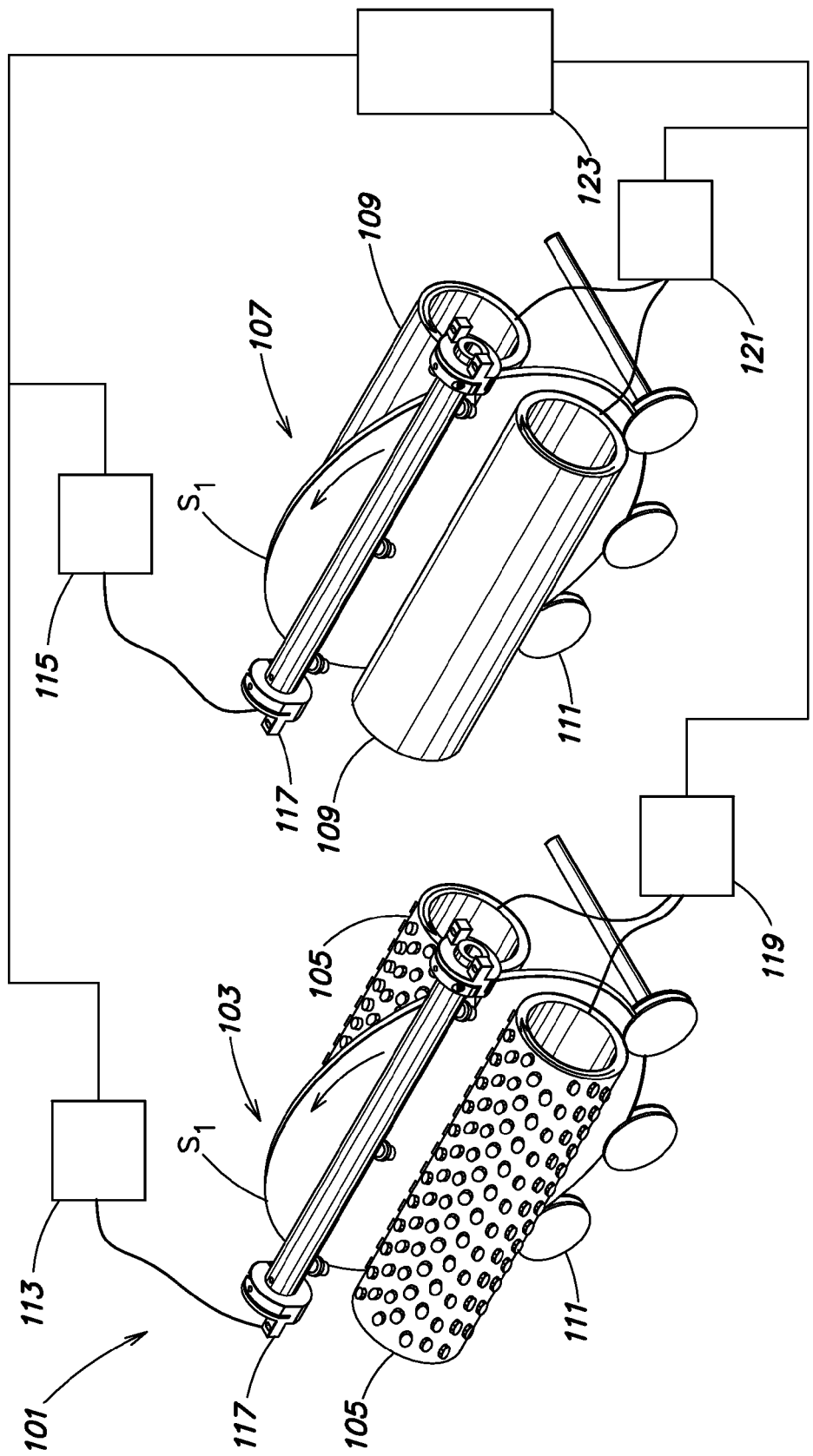
FIG. 1 is a partially schematic illustration of an inventive substrate cleaning system for cleaning a substrate in accordance with the present invention.

In an embodiment, the present invention includes a method of cleaning a substrate including scrubbing a major surface of a substrate with brushes of different (i.e., dissimilar) surface geometries. In some such embodiments, at least two brushes having different surface geometries are employed, one such brush having a profiled (e.g., nodular) surface geometry, and another such brush having a smooth surface geometry. In a first aspect, the major surface of the substrate is initially scrubbed with the brush of the nodular geometry, and is subsequently scrubbed with the brush of the smooth geometry. In a second aspect, the above order is reversed. In a further aspect, a lower concentration of cleaning chemistry is employed when scrubbing with a profiled brush, and a higher concentration employed when scrubbing with a smooth brush. Effective cleaning of a substrate's surface via scrubbing with brushes of different surface geometries may be advantageously performed after CMP processing of the substrate surface.

The present inventors have discovered that scrubbing a substrate with brushes of different surface geometries results in fewer particles remaining on the scrubbed surface as compared to the common practice in which no difference or gradient exists in the surface geometries of the brushes used to scrub a particular surface. While not intending to be bound by any particular theory, it is believed that better post CMP cleaning may be a result of a synergy involving different types of cleaning actions. For example, a brush having a profiled surface geometry (i.e., having raised surface features such as nodules) may contribute a stronger mechanical cleaning action, whereas a brush having a smooth surface geometry (e.g., a surface which includes no raised surface features or bristles) may contribute a proportionately stronger chemical cleaning action. It will be understood that chemical cleaning action includes reduction in adhesion of particles to the substrate surface. It further will be understood that surface geometry refers to brush surface profile rather than to a pore size of brush material.

Embodiments of the current invention include a substrate cleaning system that includes a pair of scrubbing apparatuses having scrubber brushes of different surface geometries. Specifically in the exemplary embodiment partially schematically illustrated in FIG. 1, an inventive substrate cleaning system 101 for cleaning a substrate S1 includes a first scrubbing apparatus 103 which employs at least one brush 105 having a nodular surface geometry (e.g., such as is discussed in more detail below with regard to FIG. 2A), and a second scrubbing apparatus 107 which employs at least one brush 109 having a smooth surface geometry (e.g., such as is discussed in more detail below with regard to FIG. 2B). The brushes of the scrubbing apparatuses of FIG. 1 may, for example, be porous and/or sponge like, and/or may be comprised of a resilient material such as polyvinyl acetate (PVA). The brushes may comprise other and/or different materials, and may exhibit other and/or different material characteristics, provided that a difference in surface geometry between brushes is present. Note also that the brushes may be supported via any known support mechanism or mechanisms (not shown) and maybe enclosed within a chamber (not shown).

Each of the exemplary scrubbing apparatuses shown in FIG. 1 may be employed to scrub a vertically oriented substrate (such as the substrate S1), and may comprise a pair of brushes so as to permit scrubbing (e.g., simultaneous scrubbing) of both major surfaces of the substrate S1, as well as rollers 111 for supporting and rotating the substrate S1. Other numbers of brushes may be used, and other substrate orientations are possible, such as a horizontal orientation, or an inclined orientation. The brushes 105, 109 are adapted to contact at least one of the same major surfaces of the substrate S1, for cleaning and/or removing slurry residue and/or other particulates/contaminants therefrom.

The inventive substrate cleaning system 101 may further include a first fluid delivery unit 113 for delivering fluid to the first scrubbing apparatus 103, and a second fluid delivery unit 115 for delivering fluid to the second scrubbing apparatus 107. (Alternatively, the same fluid delivery unit may deliver fluid to both scrubbing apparatuses.) Whether one or two fluid delivery units are employed, the same fluids may be delivered to both the scrubbing apparatuses, or different fluids may be delivered. In cases in which the same fluid is delivered to each scrubbing apparatus, the same chemical concentration or a different chemical concentration of the fluid may be delivered to each scrubbing apparatus. In an embodiment, a solution of $NH_4OH$ at a concentration of approximately 0.05% is delivered to the first scrubbing apparatus 103, and a solution of $NH_4OH$ at a concentration of approximately 1.0% is delivered to the second scrubbing apparatus 107. Greater or lesser concentrations of $NH_4OH$ may be used in either or both scrubbing apparatuses. Different types of chemicals may also and/or alternatively be used. The chemicals may, for example, be delivered in liquid form, and may aid the scrubbing process by washing slurry residue and/or other particulates/contaminants from brush and/or substrate surfaces, by facilitating dislodgement of particles/contaminants from substrate surfaces, and/or by dissolving or reducing adhesion of (e.g., via chemical reaction) particulates/contaminants disposed on brush and substrate surfaces.

As also shown in FIG. 1, each scrubbing apparatus may include one or more spray bars 117 to which the fluid delivery unit may deliver fluid. For example, the spray bar 117 may be located adjacent and to one side of the substrate S1, and may be used to direct a spray of fluid toward a first major surface of the substrate S1. Other methods of applying fluid to the surface of the substrate S1 and/or to the brushes may be used. In a particular embodiment, chemicals are delivered to each of the scrubbing apparatuses, and are sprayed on at least one major surface of the substrate S1 by the spray bars 117 while the substrate S1 is rotated at 50 RPM by the rollers 111.

In a particular embodiment, DI water is sprayed on at least one major surface of the substrate S1 for 30 seconds in order to rinse the substrate S1 after scrubbing of the major surface by the profiled brushes 105 of the first scrubbing apparatus 103, and is sprayed on the same major surface(s) of the substrate S1 for 20 seconds in order to rinse the substrate S1 after scrubbing of the major surface by the smooth brushes 109 of the second scrubbing apparatus 107.

The inventive substrate cleaning system 101 may further include a first drive device 119 which may be employed to rotate one or more of the brushes 105 of the first scrubbing apparatus 103, and a second drive device 121 which may be employed to rotate one or more of the brushes 109 of the second scrubbing apparatus 107. Alternatively, the same drive device may be employed to rotate one or more of the brushes of both scrubbing apparatuses. In a particular embodiment, each brush is closed against the corresponding major surface of the substrate S1, and is rotated at 400 RPM so as to scrub the substrate S1. It has been found that scrubbing with the profiled brushes 105 for ten seconds, and scrubbing with the smooth brushes 109 for twenty seconds provides good particle removal.

The inventive substrate cleaning system 101 may further include a controller 123 coupled to the first and second chemical delivery units 113, 115 and/or to the first and second drive devices 119, 121, and may be adapted to control the operation of the same. For example, the controller 123 may comprise a microprocessor, and the microprocessor may be programmed to activate and/or control the chemical delivery units so as to deliver chemicals to the scrubbing apparatuses at predetermined times and/or rates, and/or for a predetermined length of time. Similarly, the microprocessor of the controller 123 may be programmed to activate and/or control the drive devices so as to rotate the brushes at predetermined times and/or rates, and/or for a predetermined length of time. The microprocessor of the controller 123 may exert similar control over the delivery of DI water, and/or over the rotation of the substrate S1 by one or more of the rollers 11.

Without intending to be bound by theory, the present inventors observe that many important differences in the capacity of scrubber brushes to deliver different types and/or varying degrees of mechanical and/or cleaning actions can be attributed to surface geometry differences. For example, whether a brush is adapted to deliver shear forces of various sizes and directions beneficial for dislodging and wiping away surface particles otherwise resistant to removal via chemical action, or to provide a continuous region of brush/surface contact beneficial for trapping or otherwise maintaining fluid therebetween so as to dissolve and or reduce adhesion of surface particles which may otherwise be resistant to removal via mechanical scrubbing, would appear to be determined at least in part based on surface geometry.

Figure 2A:
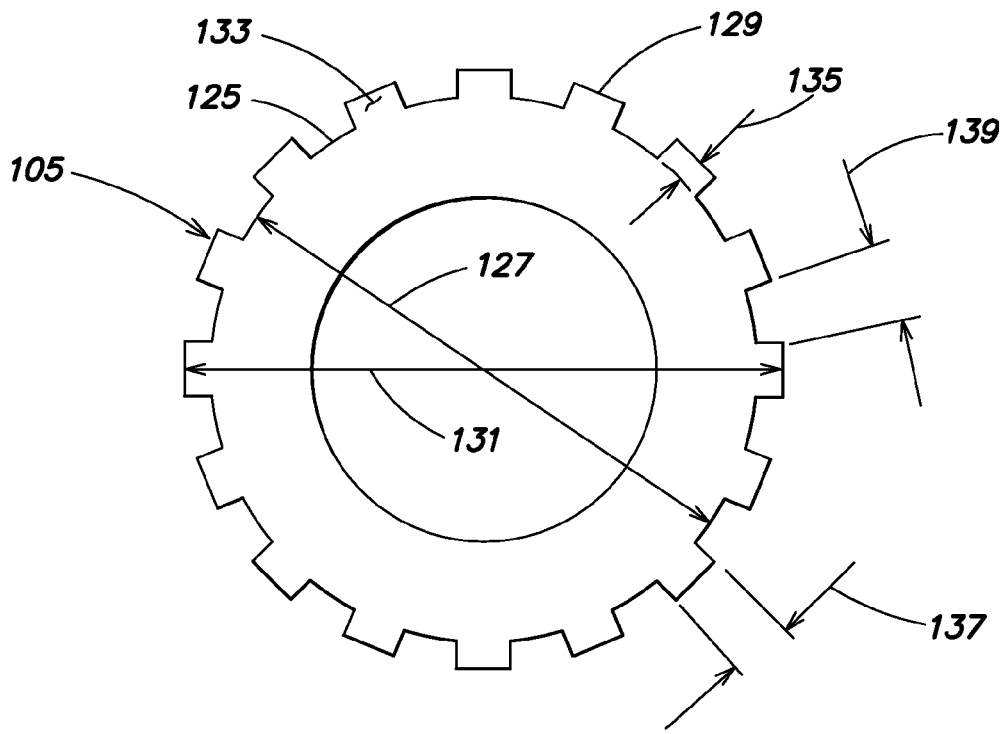
FIG. 2A is a side, cross-sectional view of an exemplary nodular surface geometry that may be employed with the substrate cleaning system of FIG. 1.
Figure 2B:
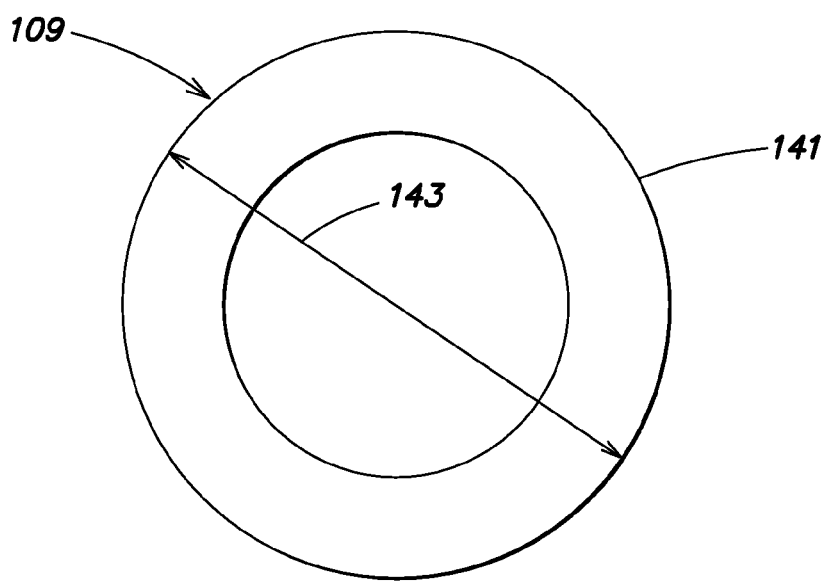
FIG. 2B is a side, cross-sectional view of an exemplary smooth surface geometry that may be employed with the substrate cleaning system of FIG. 1.

The brushes illustrated in FIGS. 2A and 2B have different surface geometries. For example, as between the exemplary embodiment of a profiled brush 105 shown in the end view of FIG. 2A, and the exemplary embodiment of a smooth brush 109 shown in the end view of FIG. 2B, profiled brush 105 may be considered to have a relatively rough surface geometry, and smooth brush 109 may be considered to have a relatively smooth surface geometry.

The profiled brush 105 of FIG. 2A features a plurality of raised regions or nodules extending radially outward. In a particular embodiment of the brush 105 of FIG. 2A, the brush surface effectively comprises an inner surface 125 described by a diameter 127, and an outer surface 129 described by a diameter 131, the outer surface 129 essentially comprising a collection of respective outward facing surfaces of a plurality of nodules 133 extending from the inner surface 125. The nodules of the particular embodiment have a height 135 and a width 137, and are separated by a peripheral spacing distance 139. Examples of suitable profiled brushes that may be employed include Rippey Symmetry nodule brushes, Texwipe Hydrocell nodule brushes, or the like. Other dimensions and/or configurations for a particular profiled brush 105, such as a combination of different sized nodules, are possible. The brush 105, being equipped with nodules such as the nodules 133, has been observed to provide good mechanical cleaning action when the brush 105 is rotated against major surfaces of the substrate S1 in the presence of cleaning chemicals, e.g., resulting in the dislodgement of particles that tend to resist removal via chemical cleaning action.

The smooth brush 109 of FIG. 2B features no such raised regions or nodules. In a particular embodiment of the smooth brush 109 of FIG. 2A, the brush surface essentially comprises a surface 141, which in one embodiment is described by a diameter 143, and is characterized in that it may or may not comprise numerous surface pores, but is also otherwise essentially peripherally and longitudinally (i.e., in a direction passing normally into the paper of FIG. 2A) continuous (i.e., the surface 141 features no nodes, bristles, or other similar raised features of a large enough size such as may amount to differences in surface geometry as the term is used herein). Examples of suitable smooth brushes that may be employed include Rippey Symmetry smooth brushes, Texwipe Hydrocell smooth brushes, or the like. The smooth brush 109 of FIG. 2B, being free of nodes and/or other discontinuities which may, for example, tend to prevent the brush 109 from providing a uniformly continuous contact pressure across the brush/surface interface, has been observed to provide good chemical cleaning action when the smooth brush 109 is rotated against surfaces of the substrate S1 in the presence of cleaning chemicals, e.g., resulting in the reduced adhesion of and/or dissolution of particles that tend to resist removal via mechanical cleaning action.

Figure 3:
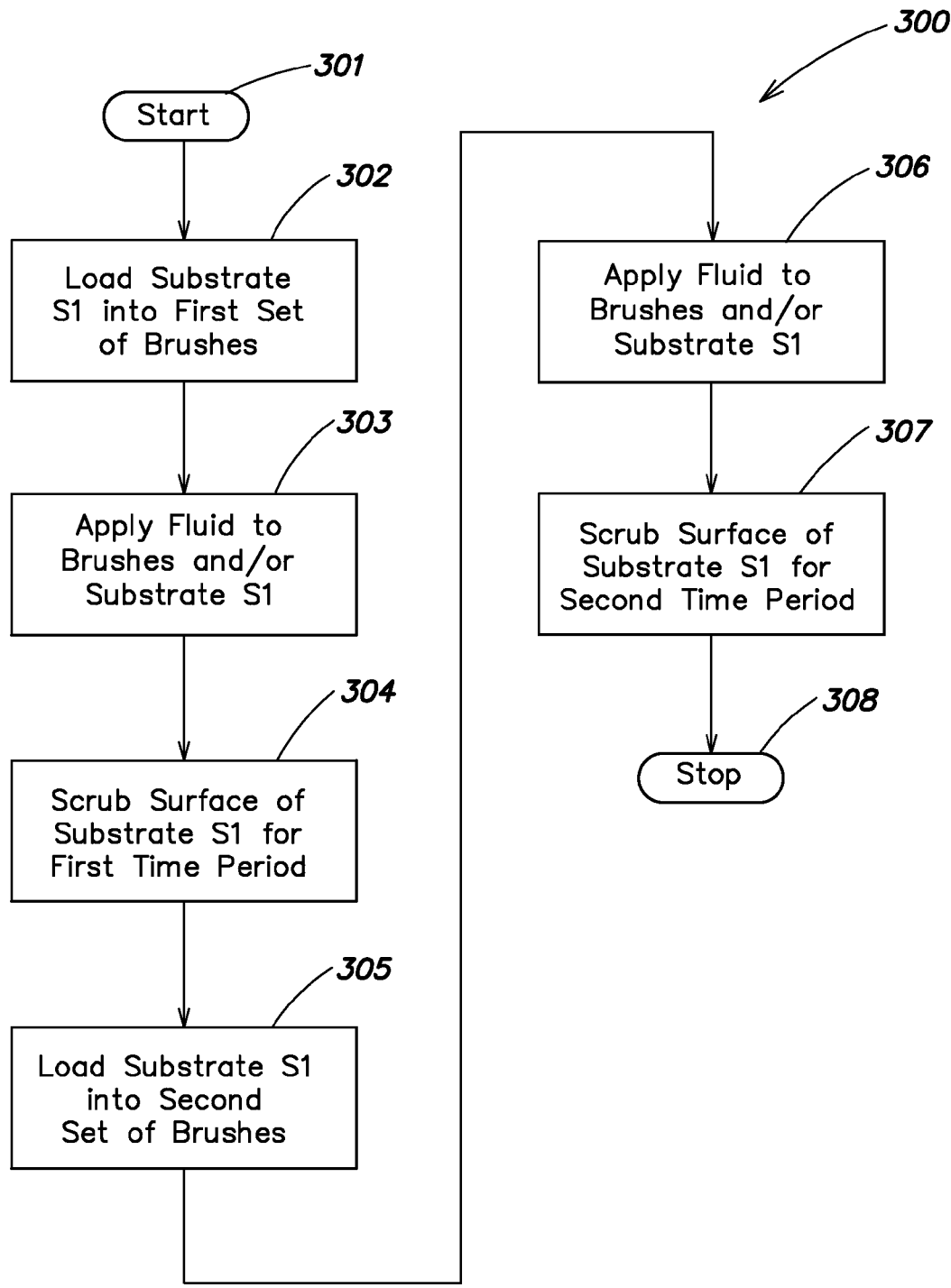
FIG. 3 illustrates a process for brush cleaning a surface of a substrate in accordance with the present invention.

FIG. 3 illustrates a process 300 for brush cleaning a surface of a substrate S1. The process 300 may start at a step 301, and proceed to a step 302.

In step 302, the substrate S1 is loaded into a first set of brushes. For example, the substrate S1 may be loaded into the first scrubbing apparatus 103 of FIG. 1 having the profiled brushes 105 of a nodular surface geometry as shown and described with respect to FIG. 2A. Other types of apparatus may be employed, as may other types of brushes (e.g., brushes having a substantially flat (rather than cylindrical) brushing surface such as a 'pancake' type brush). Such pancake brushes may be of either the nodular or smooth variety.

In a step 303, a first fluid is applied to the substrate S1. The fluid may be, for example, an aqueous solution of $NH_4OH$. Deionized water or other chemistries alternatively may be applied. One or more of many different methods and/or apparatus for applying the first fluid to the substrate S1 may be employed, such as a spray bar similar to the spray bar 117 of FIG. 1 via the first fluid delivery apparatus 113, a pressurized delivery of the first fluid outward of the brush surface via the pores of the brush surface, etc., e.g., so long as the first fluid is permitted to contact the surface of the substrate S1 so as to facilitate cleaning thereof. The step 303 may accordingly occur before, during, and/or after the step 302, e.g., as may be predetermined as part of an overall cleaning recipe.

In a step 304, the surface of the substrate S1 is scrubbed by the brushes described above with respect to the step 302. For example, a profiled brush 105 such as is shown in FIG. 1 may be closed against the major surface of the substrate S1 and rotated relative to the substrate for a first time period (e.g., ten seconds in duration) so as to create a mechanical cleaning action. The fluid application function of step 303 may also occur during the first time period in which the surface of the substrate S1 is being scrubbed. The step of closing the scrubbing brush against the substrate S1 may alternatively occur earlier, e.g., as part of one of the steps 302 or 303.

In a step 305, the substrate S1 is loaded into a second set of brushes. For example, the substrate S1 may be loaded into the scrubbing apparatus 107 of FIG. 1 having the smooth brushes 109 of a smooth surface geometry as shown and described with respect to FIG. 2B. As in the step 302, other types of apparatus may be employed, as may other numbers or types of brushes (e.g., pancake brushes having a substantially planar brushing surface, rather than a cylindrical-type brushing surface such as is shown in FIG. 1). Further, although the step 305 may also include unloading the substrate S1 from the first set of brushes of step 302 before loading the substrate S1 into the second set of brushes of step 305, the step 305 may occur either before, simultaneously with, or after the step 302. For example, a brush having two different surface geometries or two or more brushes that have surface geometries that are different from each other, may be employed in a single scrubbing step.

In a step 306, a fluid is applied to the substrate S1. As in step 303, the fluid used may be a chemistry, such as an aqueous solution of $NH_4OH$, it being also understood that other chemistries or deionized water may be applied in addition or as an alternative thereto. Also as in the step 303, one or more of many different methods and/or apparatus for applying the fluid to the substrate S1 may be employed, e.g., so long as the fluid is permitted to contact the surface of the substrate S1 so as to facilitate cleaning thereof. The step 306 may accordingly occur before, during, and/or after the step 305.

In a step 307, the surface of the substrate S1 is scrubbed by the brushes described above with respect to the step 305. For example, a smooth brush 109 such as is shown in FIG. 1 may be closed against the major surface of the substrate S1 and rotated relative to the substrate for a second time period (e.g., twenty seconds in duration) so as to create a cleaning action. The fluid application function of step 306 may also occur as the surface of the substrate S1 is scrubbed. As in the step 304, the step of closing the brush against the substrate S1 may alternatively occur earlier, e.g., as part of one of the steps 305 or 306. Also, although especially good results may be achievable via the second time period following the first time period without any overlap, the first and second time periods of the steps 304 and 307 may alternatively overlap and/or substantially coincide as is the case when a substrate travels through a path defined by a plurality of brushes (e.g., rather than rotating in place). The process 300 may then end at a step 308.

Although the use in step 307 of the particular smooth brush 109 illustrated in FIG. 2B and described above may contribute to overall improved chemical cleaning, other types of brushes than the smooth brush 109 of FIG. 2B may be used, including one or more embodiments of a brush that is relatively smooth with respect to the brush used in the step 304, but which may not be entirely smooth. For example, the brushes described above with respect to step 305 may be of a surface geometry that is different from that of the smooth brush 109 of FIG. 2B in that it contains surface features that are of a scale of a tenth of a millimeter or larger, but which are smaller by the same scale than the surface features of the profiled brush 105 of FIG. 2A, such that a difference in surface geometry in accordance with the present invention exists between the brushes used in the step 304 and the brushes used in the step 307.

The foregoing description discloses only particular embodiments of the invention; modifications of the above disclosed methods and apparatus which fall within the scope of the invention will be readily apparent to those of ordinary skill in the art. For instance, a horizontal orientation of the substrate S1 within a scrubbing apparatus may be provided, rather than a vertical orientation as shown in FIG. 1, and the scrubbing apparatus may be equipped for scrubbing only one major surface and/or an edge surface of the substrate S1, rather than two major surfaces as shown. Also, if the steps 304 and 307 of the process 300 of FIG. 3 are performed sequentially, as opposed to simultaneously, other/additional steps may intervene therebetween, such as one or more rinsing steps (e.g., DI water rinse), and/or one or more drying steps (e.g., Marangoni drying). The order of the steps 304 and 307 may be reversed, e.g., such that a smooth brush is used first, followed by a profiled brush. Further, both brush types may be incorporated within a single scrubbing apparatus, and/or the substrate S1 may be caused to pass along and/or through a series of brushes of different surface geometries, and as such may not need to be rotated in place. As well, the present process need not necessarily follow a chemical mechanical polishing (CMP) process. Accordingly, other types of substrate processing other than CMP processing may precede the present cleaning process, and/or the present process may be performed in the absence of CMP processing.

Accordingly, while the present invention has been disclosed in connection with specific embodiments thereof, it should be understood that other embodiments may fall within the spirit and scope of the invention, as defined by the following claims.

The invention claimed is:

1. A method of cleaning a substrate comprising:
scrubbing a first surface of the substrate with a brush having a first surface geometry, wherein the first surface geometry is smooth relative to a brush having a second surface geometry and adapted to dislodge particles resistant to mechanical cleaning action; and then after the first surface of the substrate is scrubbed with the brush having the first surface geometry, scrubbing the first surface of the substrate with the brush having the second surface geometry, wherein the second surface geometry is profiled and adapted to dislodge particles resistant to chemical cleaning action, and wherein the first and the second surface geometries are different; and
applying a first concentration of a first cleaning fluid to the substrate while scrubbing the substrate with the brush having the first smooth surface geometry and applying a second concentration of the first cleaning fluid to the substrate while scrubbing the substrate with the brush having the second profiled surface geometry;
wherein the first concentration of the first cleaning fluid is a higher concentration than the second concentration of the first cleaning fluid.

2. The method of claim 1, wherein scrubbing with the brush having the smooth surface geometry comprises:
trapping a cleaning fluid between the first surface of the substrate and the brush having the smooth surface geometry.

3. The method of claim 1 wherein the profiled geometry includes nodules.

4. The method of claim 1 further comprising:
applying a second cleaning fluid to the substrate while scrubbing the substrate with the brush having the second surface geometry.

5. The method of claim 4 wherein applying the first cleaning fluid to the substrate further comprises:
spraying the cleaning fluid toward the first surface of the substrate.

6. The method of claim 4, wherein the first and second cleaning fluids include different types of chemicals.

7. The method of claim 1 wherein the brush with the first surface geometry includes a pair of first surface geometry brushes and the brush with the second surface geometry includes a pair of second surface geometry brushes.

8. The method of claim 7 further comprising:
loading the substrate into the pair of first surface geometry brushes of a scrubbing apparatus before scrubbing the first surface of the substrate.

9. The method of claim 8 further comprising:
loading the substrate into the pair of second surface geometry brushes of the scrubbing apparatus after scrubbing the first surface of the substrate with the pair of first surface geometry brushes.

10. The method of claim 1 wherein the first surface of the substrate is scrubbed with the brush with the first surface geometry for a first time period and the first surface of the substrate is scrubbed with the brush with the second surface geometry for a second time period.

11. The method of claim 1 further comprising:
spraying the first surface of the substrate with DI water after scrubbing with the brushes.

* * * * *